United States Patent
Uchida

(10) Patent No.: US 8,063,414 B2
(45) Date of Patent: Nov. 22, 2011

(54) COMPACT STANDARD CELL

(75) Inventor: Hirofumi Uchida, Tokyo (JP)

(73) Assignee: Oki Semiconductor Co., Ltd. (JP)

( * ) Notice: Subject to any disclaimer, the term of this patent is extended or adjusted under 35 U.S.C. 154(b) by 845 days.

(21) Appl. No.: 11/785,960

(22) Filed: Apr. 23, 2007

(65) Prior Publication Data

US 2007/0300202 A1 Dec. 27, 2007

(30) Foreign Application Priority Data

Jun. 23, 2006 (JP) .................................. 2006-173387

(51) Int. Cl.
*H01L 27/118* (2006.01)

(52) U.S. Cl. ................. 257/206; 257/207; 257/E21.632; 257/E27.108

(58) Field of Classification Search .................. 438/199, 438/311; 257/202, 204, 206, 207, 347, E27.108, 257/E21.632, E27.112, E21.32
See application file for complete search history.

(56) References Cited

U.S. PATENT DOCUMENTS 6,410,972 B1 6/2002 Sei et al.
2002/0177260 A1* 11/2002 Matsumoto .................... 438/154

FOREIGN PATENT DOCUMENTS

JP 2001-094054 4/2001

* cited by examiner

*Primary Examiner* — Khiem D Nguyen
(74) *Attorney, Agent, or Firm* — Studebaker & Brackett PC; Donald R. Studebaker

(57) ABSTRACT

A standard cell, placed between a power rail and a ground rail in an integrated circuit, has active areas with connecting arms that extend beneath the power rail and ground rail. The connecting arms conduct current between the power and ground rails and the source regions of transistors in the active areas. The connecting arms include segments extending from these source regions to points beneath the power and ground rails, and segments running longitudinally beneath the power and ground rails. The connecting arms replace metal wiring that would otherwise be required, enabling the size of the standard cell to be reduced.

16 Claims, 7 Drawing Sheets

FIG.3
PRIOR ART
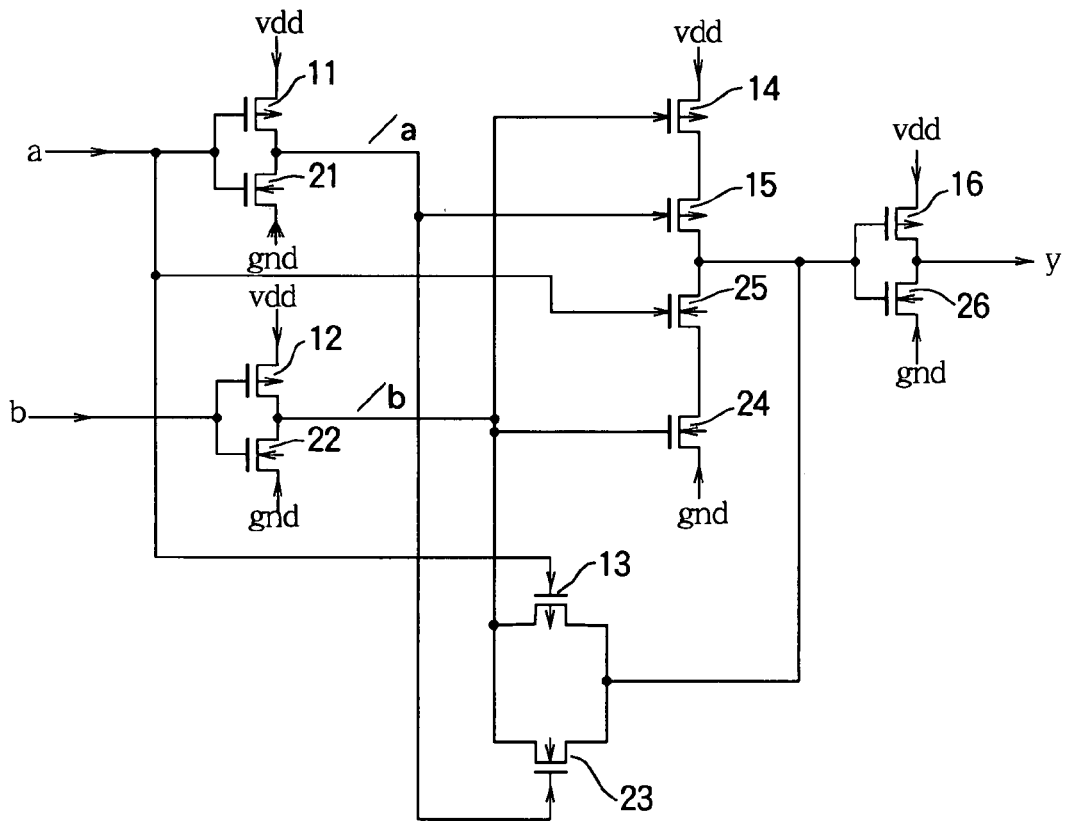
FIG.4
PRIOR ART
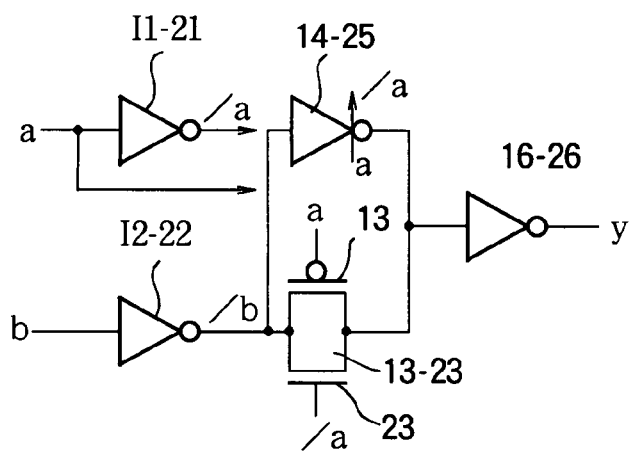
FIG.5
PRIOR ART

US 8,063,414 B2

COMPACT STANDARD CELL

BACKGROUND OF THE INVENTION

1. Field of the Invention

The present invention relates to a standard cell useful in the fabrication of a semiconductor integrated circuit on, for example, a silicon-on-insulator (SOI) substrate.

2. Description of the Related Art

Standard cells are widely used in the design of semiconductor integrated circuits. A conventional standard two-input NAND cell and a conventional two-input exclusive OR (XOR) cell will be described below. Descriptions of conventional two-input NAND cells can also be found in Japanese Patent Application Publication No. 2001-94054 and the corresponding U.S. Pat. No. 6,410,972 to Sei et al.

A standard two-input NAND cell is shown as a circuit diagram in FIG. 1 and a circuit symbol in FIG. 2. The two-input NAND cell performs a NOT-AND logic operation on two input signals a, b to generate an output signal y. The constituent elements of the cell are a p-channel metal-oxide-semiconductor (PMOS) transistor 1 and an n-channel metal-oxide-semiconductor (NMOS) transistor 3 connected in series to a power supply (vdd) rail, a PMOS transistor 2 connected in parallel with PMOS transistor 1 between the vdd rail and the drain electrodes of PMOS transistor 1 and NMOS transistor 3, and an NMOS transistor 4 connected in series with NMOS transistor 3 between the source electrode of NMOS transistor 3 and a ground (gnd) rail. Input signal a is applied to the gate electrodes of transistors 1 and 3, input signal b is applied to the gate electrodes of transistors 2 and 4, and the output signal y is taken from drains of transistors 1, 2, and 3. The output signal y goes to the low logic level when both inputs a, b are at the high logic level, because both NMOS transistors 3, 4 are turned on and both PMOS transistors 1, 2 are turned off. When at least one of the inputs a, b is low, the output signal y goes to the high logic level, because at least one of the NMOS transistors 3, 4 is turned off and one of the PMOS transistors 1, 2 is turned on.

The conventional two-input XOR cell is shown as a circuit diagram in FIGS. 3 and 4 and a circuit symbol in FIG. 5. The two-input XOR cell performs an exclusive logical OR operation on two input signals a, b to generate an output signal y. The constituent elements of the cell are three inverters 11-12, 12-22, 16-26, an analog switch 13-23, and a tri-state inverter 14-25. Inverter 11-12, which inverts input signal a and outputs the inverted signal /a, comprises a PMOS transistor 11 and an NMOS transistor 21 connected in series between the vdd rail and the ground rail. Inverter 12-22, which inverts input signal b and outputs the inverted signal /b, comprises a PMOS transistor 12 and an NMOS transistor 22 connected in series between the vdd rail and the ground rail. The analog switch 13-23, which opens and closes the electrical path between the output of the inverter 12-22 and the input of the inverter 16-26 in response to input a, comprises a PMOS transistor 13 and an NMOS transistor 23 connected in parallel. The tri-state inverter 14-25, which generates an output at the b logic level when input a is high and is in the high-impedance state when input a is low, comprises PMOS transistors 14, 15 and NMOS transistors 24, 25 connected in series between the vdd rail and the ground rail. The final-stage inverter 16-26, which generates the output signal y by inverting the output of the tri-state inverter 14-25 when input a is high and the output of the analog switch 13-23 when input a is low, comprises a PMOS transistor 16 and an NMOS transistor 26 connected in series between the vdd rail and the ground rail. When the inputs a, b are at matching logic levels (both high or both low), the output signal y goes to the low logic level. Otherwise (when the input logical levels do not match), the output signal y goes to the high logic level.

A conventional layout of the standard two-input NAND cell shown in FIG. 1 is shown in plan view in FIG. 6 and in a schematic sectional view in FIG. 7, which is taken through line Y1-Y2 in FIG. 6.

Referring to FIG. 6, the conventional standard two-input NAND cell is outlined by a rectangular cell boundary 30 with two opposite sides (the upper and lower sides in the drawing) disposed below the vdd rail 31 and ground rail 32. The vdd and ground rails 31, 32 are metal. A p-type ($p^+$) semiconductor active area 33 and an n-type ($n^+$) semiconductor active area 34 are disposed in the upper and lower parts, respectively, of the space between the rails 31, 32. An input terminal 35 for input signal a, an input terminal 36 for input signal b, and an output terminal 38 for the output signal y are aligned between the active areas 33, 34. PMOS transistor 1 occupies the left side of the $p^+$ active area 33 and PMOS transistor 2 occupies the right side. NMOS transistor 3 occupies the right side of the $n^+$ active area 34 and NMOS transistor 4 occupies the left side.

PMOS transistor 1 has a gate electrode 1g, a source region 1s, and a drain region 1d. The gate electrode 1g is a strip of polycrystalline silicon (polysilicon) extending generally vertically in the drawing across the $p^+$ active area 33. The source region 1s and drain region 1d are highly doped p-type regions, referred to as $p^+$ diffusion regions, disposed to the left and right, respectively, of the gate electrode 1g. The gate electrode 1g is connected through a contact plug to input terminal 35; the source region 1s is connected through a contact plug 31c to a short metal wire or stub 31a extending from the vdd rail 31 to a point above the source region is; the drain region 1d is connected through another contact plug and a metal wire 37 to the output terminal 38.

In the drawings, metal is indicated by hatching that slants toward the upper right, and polysilicon is indicated by hatching that slants toward the upper left.

PMOS transistor 2 has a gate electrode 2g, a source region 2s, and a drain region 2d. The gate electrode 2g is another strip of polysilicon extending generally vertically in the drawing across the $p^+$ active area 33. The source region 2s and drain region 2d are $p^+$ diffusion regions disposed to the right and left, respectively, of the gate electrode 2g. The gate electrode 2g is connected through a contact plug to input terminal 36; the source region 2s is connected through a contact plug 31c to another metal stub 31b extending from the vdd rail 31; the drain region 2d coincides with the drain region 1d of PMOS transistor 1 and is thus connected to the output terminal 38.

NMOS transistor 3 has a gate electrode 3g, a source region 3s, and a drain region 3d. The gate electrode 3g is a strip of polysilicon extending generally vertically in the drawing across the $n^+$ active area 34. The source region 3s and drain region 3d are highly doped n-type regions ($n^+$ diffusion regions) disposed to the left and right, respectively, of the gate electrode 3g, which is continuous with the gate electrode 2g of PMOS transistor 2. The drain region 3d is connected through a contact plug and the metal wire 37 to the output terminal 38.

NMOS transistor 4 has a gate electrode 4g, a source region 4s, and a drain region 4d. The gate electrode 4g is a strip of polysilicon extending generally vertically in the drawing across the $n^+$ active area 34. The source region 4s and drain region 4d are $n^+$ diffusion regions disposed to the left and right, respectively, of the gate electrode 4g, which is continuous with the gate electrode 1g of PMOS transistor 1. The source region 4s is connected through a contact plug 32c to a metal stub 32a extending from the ground rail 32. The drain region 4d coincides with the source region 3s of NMOS transistor 3.

As shown in FIG. 7, the standard two-input NAND cell is formed on an SOI wafer 40 comprising a silicon supporting substrate 41, a thick insulating film 42, and a thin silicon semiconductor film 43. The thick insulating film 42 is an oxide film, also referred to as a buried oxide or BOX film because it is buried between the silicon films 41, 43. The source and drain diffusion regions of the transistors 1, 2, 3, 4 are formed by implantation of impurity ions into the thin silicon semiconductor film 43, which is also referred to below as the SOI layer. Only source regions 1s and 4s are visible in FIG. 7. The diffusion regions are covered by an interlayer dielectric film 44 through which the source contact plugs 31c, 32c and other contact plugs mentioned above extend. The vdd rail 31, ground rail 32 and their stubs 31a, 31b, 32a, the input and output terminals 35, 36, 38, and the metal wire 37 are disposed in a lowermost metal wiring layer on the surface of the interlayer dielectric film 44.

FIG. 8 is a plan view of an exemplary conventional layout of the two-input XOR cell in FIG. 3. The layout includes a vdd rail 51 and a ground rail 52, which are metal strips disposed on two opposite sides (the upper and lower sides in the drawing) of the rectangular cell boundary 50. The lateral size of the cell boundary 50 in FIG. 8 is eight 'grids', that is, eight times the distance between adjacent lines in the grid of lines used to align the cell components when the cell is designed on, for example, a computer screen. The grid is indicated by vertical and horizontal lines in the drawing. The input and output terminals 55, 56, 58 are centered on grid intersections.

A p+ active area 53 and an n+ active area 54 are disposed in the upper and lower parts, respectively, of the space between the rails 51, 52. An input terminal 55 for input signal a, an input terminal 56 for input signal b, and an output terminal 58 for the output signal y are disposed in the space between the active areas 53 and 54. The PMOS transistors 11 to 16 and NMOS transistors 21 to 26 constituting the inverters 11-21, 12-22, analog switch 13-23, tri-state inverter 14-25, and final stage inverter 16-26 are formed in the active areas, PMOS transistors being formed in the p+ active area 53 and NMOS transistors in the n+ active area 54. The output terminals of the tri-state inverter 14-25 and analog switch 13-23 are connected through a metal wire 57 to the input terminal of the final stage inverter 16-26.

PMOS transistors 11 and 14 share a common source region that is connected through a contact plug to a metal stub 51a extending from the vdd rail 51. PMOS transistors 12 and 16 share a common source region that is connected through a contact plug to another metal stub 51b extending from the vdd rail 51. Similarly, NMOS transistors 21 and 24 share a common source region that is connected through a contact plug to a metal stub 52a extending from the ground rail, and NMOS transistors 22 and 26 share a common source region that is connected through a contact plug to another metal stub 52b extending from the ground rail 52. The vdd and ground rails 51, 52, their stubs 51a, 51b, 52a, 52b, the input and output terminals 55, 56, 58, the metal wire 57, and other metal interconnecting wires are all disposed in the same (e.g., lowermost) layer of metal wiring.

With the increasing density of semiconductor integrated circuits comes an increasing demand for reduced cell size. This demand can be met by reducing the sizes of the transistors constituting the standard cells, but only to a limited extent, because the driving capability of a transistor decreases when its size is reduced. An alternative method is to find a more compact layout, but in conventional standard cells described above, the compactness of the layout is limited by the following factors.

(i) The standard cell in FIG. 6 requires metal stubs 31a, 31b, 32a to connect the vdd rail 31 and ground rail 32 to the source regions of the PMOS transistors 1, 2 and NMOS transistor 4. These source regions 1s, 2s, 4s must be enlarged to make room for the contact plugs 31c, 32c below the stubs and to allow for alignment error.

(ii) The metal stubs 51b, 52b that connect the vdd and ground rails 51, 52 to the source regions of PMOS transistor 16 and NMOS transistor 26 in the final stage inverter 16-26 in FIG. 8 must fit into the space between the gate electrodes of these transistors 16, 26 and the metal wire 57 that connects those gate electrodes to the outputs of the tri-state inverter 14-25 and analog switch 13-23. Space must be left between this metal wire 57 and the metal stubs 51b, 52b, because they are disposed in the same metal wiring layer. As a result of these spacing requirements, the source areas 16s, 26s of transistors 16, 26 must have large lateral dimensions, making it hard to reduce the total width of the cell to less than the eight grids shown in FIG. 8.

SUMMARY OF THE INVENTION

The invented standard cell comprises a vdd rail and a ground rail, active areas disposed between the vdd rail and the ground rail, and a plurality of transistors formed in the active areas. The active areas have connecting arms extending beneath the vdd rail and the ground rail and are connected through the connecting arms to the vdd rail and the ground rail.

The connecting arms replace some of the metal stubs that took up space in the conventional layouts. The size of the active areas can be reduced because they do not need to include space for contacts with the metal stubs that have been replaced, and other cell features do not have to avoid these metal stubs. The size of the standard cell can accordingly be reduced.

BRIEF DESCRIPTION OF THE DRAWINGS

In the attached drawings:

FIGS. 3 and 4 are circuit diagrams of a two-input XOR cell;

FIG. 5 shows a standard symbol for a two-input XOR cell;

DETAILED DESCRIPTION OF THE INVENTION

Figure 1:
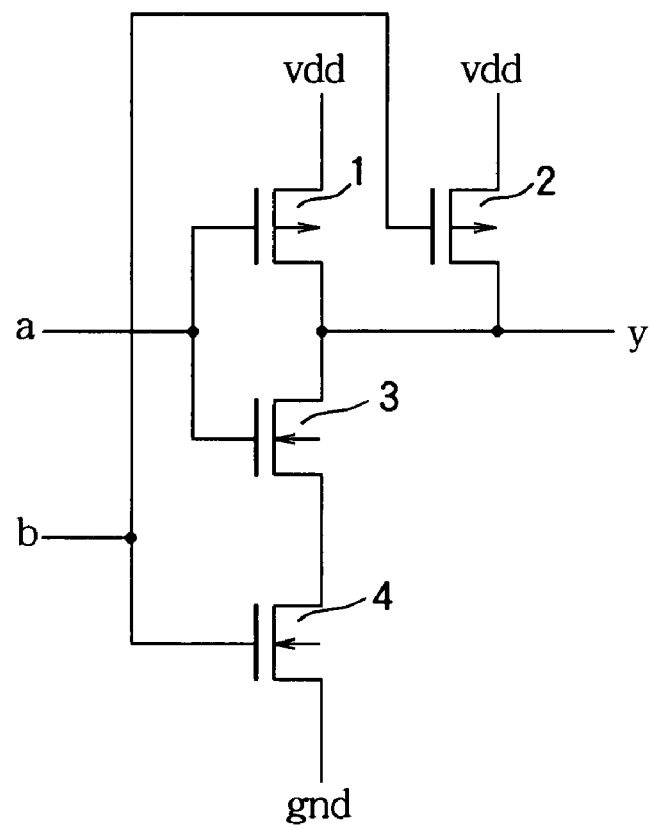
FIG. 1 is a circuit diagram of a two-input NAND cell.
Figure 2:
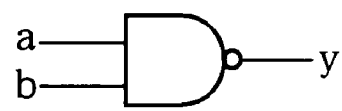
FIG. 2 shows a standard symbol for a two-input NAND cell.

Embodiments of the invention will now be described with reference to the attached drawings, in which like elements are indicated by like reference characters.

First Embodiment

Figure 6:
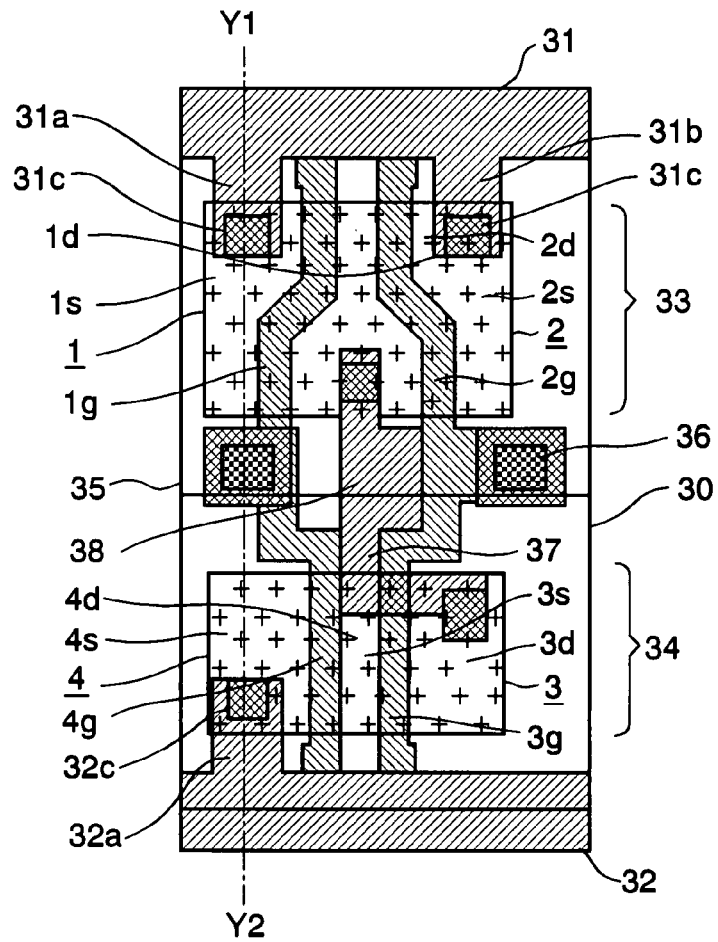
FIG. 6 is a plan view of a conventional layout of a two-input NAND cell.
Figure 7:
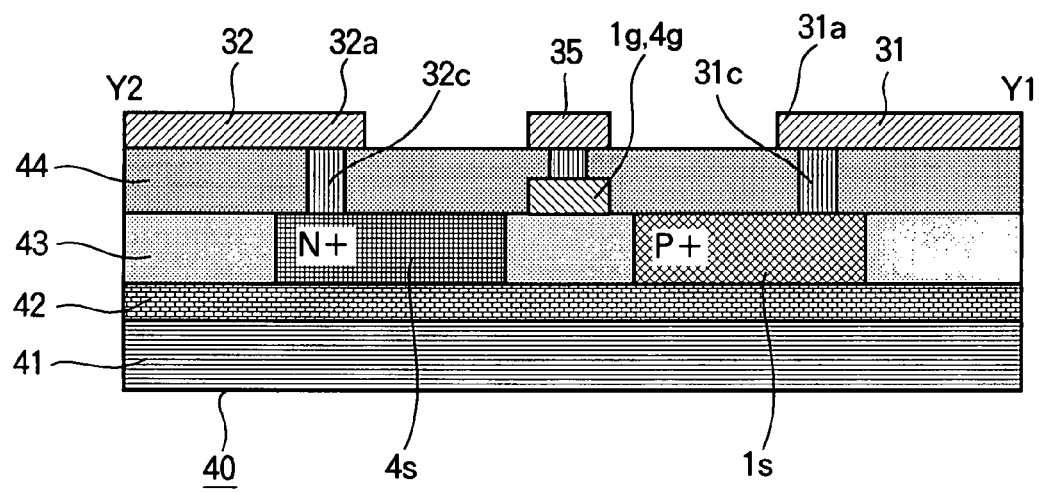
FIG. 7 is a sectional view of the conventional two-input NAND cell in FIG. 6.
Figure 9:
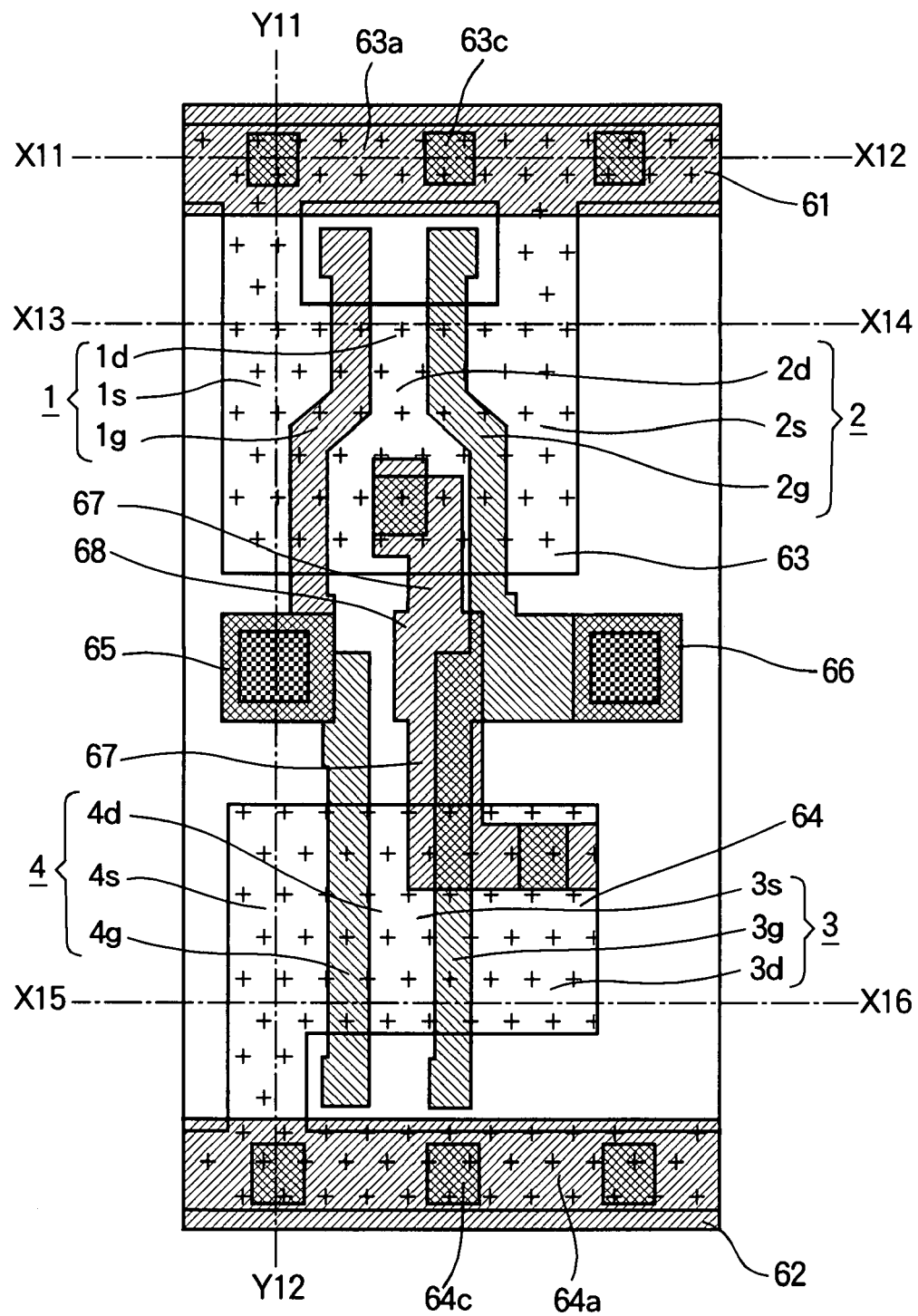
FIG. 9 is a plan view of a two-input NAND cell embodying the present invention.

Referring to FIG. 9, the first embodiment is a standard two-input NAND cell having a rectangular cell boundary 60 with a reduced lateral dimension. That is, the width-to-height ratio of the cell boundary 60 is less than the width-to-height ratio of the conventional rectangular cell boundary 30 in FIG. 6. As in FIG. 6, the layout includes a vdd rail 61 extending laterally across the top edge and a ground rail 62 extending laterally across the bottom edge of the cell, a p$^+$ active area 63 in which PMOS transistors are formed, and an n$^+$ active area 64 in which NMOS transistors are formed.

The p$^+$ active area 63 differs from the conventional p$^+$ active area in having a π-shaped connecting arm 63a with segments extending upward in the drawing from two points in the main body of the p$^+$ active area 63 and a segment running laterally beneath the vdd rail 61, as indicated by the cross marks beneath the vdd rail 61. This connecting arm 63a is connected to the vdd rail 61 by a plurality of contact plugs 63c equally spaced beneath the vdd rail 61.

Similarly, the lower n$^+$ active area 64 differs from the conventional n$^+$ active area in having a T-shaped connecting arm 64a with a segment extending downward in the drawing to join a segment running laterally beneath the ground rail 62, as indicated by the cross marks beneath the ground rail 62. This connecting arm 64a is connected to the ground rail 62 by a plurality of contact plugs 64c equally spaced beneath the ground rail 62.

An input terminal 65 for input signal a in FIG. 1, an input terminal 66 for input signal b, and an output terminal 68 for the output signal y are disposed between the p$^+$ active area 63 and the n$^+$ active area 64.

The PMOS transistors 1, 2 shown in FIG. 1 are disposed side by side in the p$^+$ active area 63, with PMOS transistor 1 on the left and PMOS transistor 2 on the right. The NMOS transistors 3, 4 in FIG. 1 are disposed side by side in the n$^+$ active area 64, with NMOS transistor 3 on the right and NMOS transistor 4 on the left.

PMOS transistor 1 has a polysilicon gate electrode 1g running generally vertically through the p$^+$ active area 33, a source region 1s disposed on the left of the gate electrode 1g, and a drain region 1d disposed on the right of the gate electrode 1g. The source region 1s and drain region 1d are p$^+$ diffusion regions. The gate electrode 1g is connected through a contact plug to input terminal 65; the source region 1s is connected through the connecting arm 63a and contact plugs 63c to the vdd rail 61; the drain region 1d is connected through a contact plug and metal wire 67 to the output terminal 68.

PMOS transistor 2 has a polysilicon gate electrode 2g running generally vertically through the p$^+$ active area 33, a source region 2s disposed on the right of the gate electrode 2g, and a drain region 2d disposed on the left of the gate electrode 2g. The source region 2s and drain region 2d are p$^+$ diffusion regions. The gate electrode 2g is connected through a contact plug to input terminal 66; the source region 2s is connected through the connecting arm 63a and contact plugs 63c to the vdd rail 61; the drain region 2d, which coincides with the drain region 1d of PMOS transistor 1, is connected through the same contact plug and metal wire 67 to the output terminal 68.

NMOS transistor 3 has a polysilicon gate electrode 3g running vertically through the p$^+$ active area 33, a source region 3s disposed on the left of the gate electrode 3g, and a drain region 3d disposed on the right of the gate electrode 3g. The source region 3s and drain region 3d are n$^+$ diffusion regions. The gate electrode 3g is a continuous extension of the gate electrode 2g in PMOS transistor 2. The drain region 3d is connected through a contact plug and the metal wire 67 to the output terminal 68.

NMOS transistor 4 has a polysilicon gate electrode 4g running vertically through the p$^+$ active area 33, a source region 4s disposed on the left of the gate electrode 4g, and a drain region 4d disposed on the right of the gate electrode 4g. The source region 4s and drain region 4d are n$^+$ diffusion regions. The gate electrode 4g is a continuous extension of the gate electrode 1g in PMOS transistor 1. The source region 4s is connected through the connecting arm 64a and contact plugs 64c to the ground rail 62. The drain region 4d coincides with the source region 3s of NMOS transistor 3.

Figure 10:
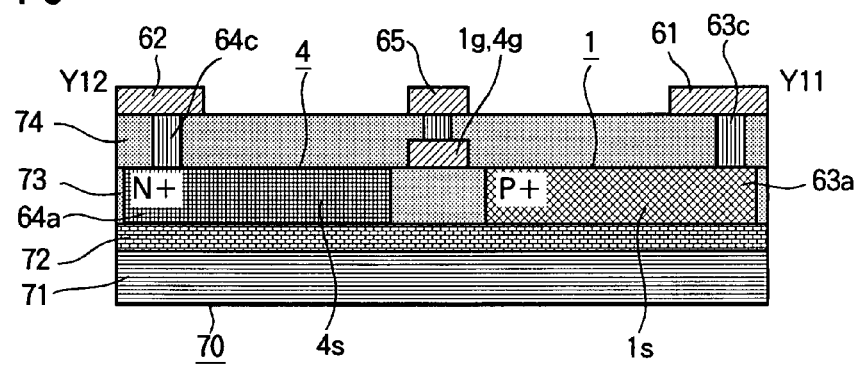
FIGS. 10, 11, 12, and 13 are sectional views of the two-input NAND cell in FIG. 9.
Figure 11:
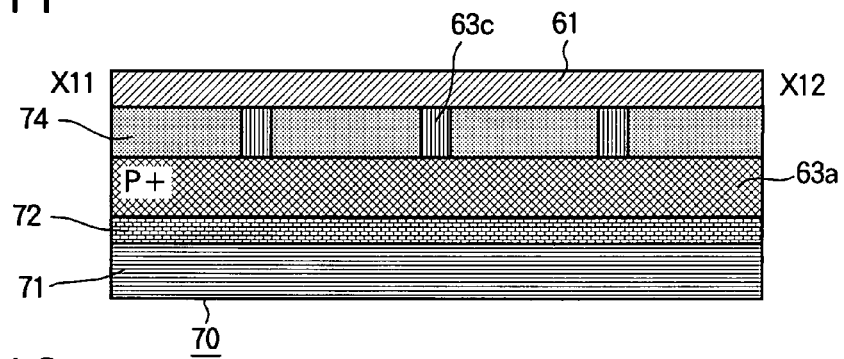
Figure 12:
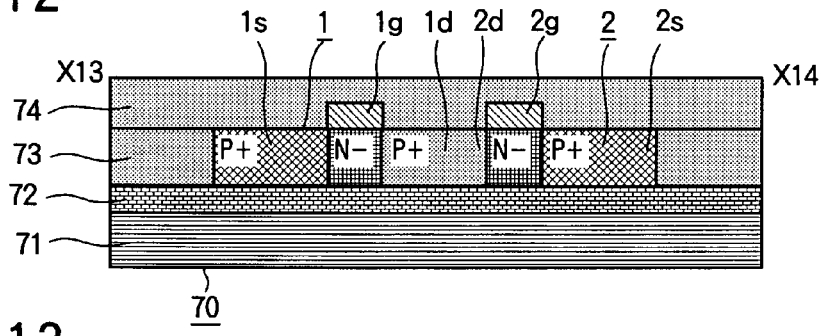
Figure 13:
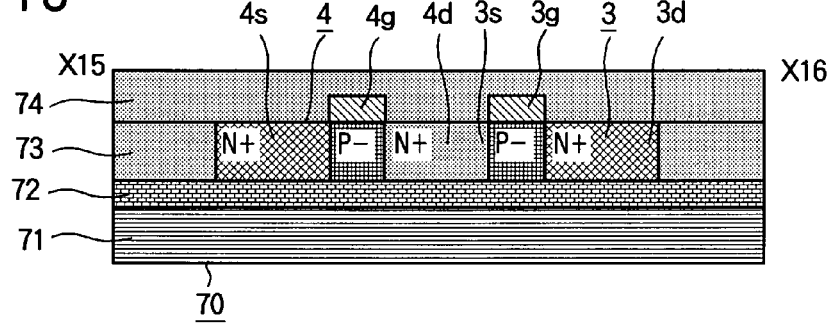

FIGS. 10 to 13 are sectional views of this two-input NAND cell. FIG. 10 is taken through line Y11-Y12, FIG. 11 through X11-X12, FIG. 12 through line X13-X14, and FIG. 13 through line X15-X16 in FIG. 9.

The standard two-input NAND cell is formed on an SOI wafer 70 comprising a silicon supporting substrate 71, a thick insulating film (BOX film) 72, and a thin silicon semiconductor film (the SOI layer) 73. The BOX film 72 is sandwiched between the silicon supporting substrate 71 and SOI layer 73. The source and drain diffusion regions 1s to 4s and 1d to 4d of transistors 1, 2, 3, 4 are formed in the SOI layer 73.

The transistors 1, 2, 3, 4 may be formed by first implanting n-type impurity ions into the entire p$^+$ active region 33 and p-type impurity ions into the entire n$^+$ active region 34 at low concentrations, so that the p$^+$ active region 33 is initially an n-type (n$^-$) diffusion region and the n$^+$ active region 34 is initially a p-type (p$^-$) diffusion region. After the gate electrodes 1g, 2g, 3g, 4g are formed, they are used as a mask while p-type impurity ions are implanted at a high concentration into the p$^+$ active region 33 to form the source and drain regions of the PMOS transistors 1, 2, and n-type impurity ions are implanted at a high concentration into the n$^+$ active region 33 to form the source and drain regions of the NMOS transistors 3, 4.

The transistors 1, 2, 3, 4 are covered by an interlayer dielectric film 74. The contact plugs 63c, 64c that connect the connecting arms 63a, 64a to the vdd and ground rails 61, 62, the contact plugs that connect the gate electrodes 1g, 2g, 3g, 4g to the input terminals 65, 66, and the contact plugs that connect the drain regions 1d, 2d, 3d of PMOS transistors 1, 2 and NMOS transistor 3 to the metal wire 67 extend through holes in the interlayer dielectric film 74. The contact plugs may be made of metal, or of a nonmetallic conductive material such as polysilicon. The metal wire 67, input and output terminals 65, 66, 68, vdd rail 61, and ground rail 62 are all formed in a lowermost metal wiring layer on the surface of the interlayer dielectric film 74. (Other metal wiring layers may be present but are not shown.)

When a power supply potential (vdd) and a ground potential are applied to the vdd rail 61 and ground rail 62, respectively, the vdd potential is supplied through contact plugs 63c and connecting arm 63a to the source regions 1s, 2s of PMOS transistors 1, 2 and the ground potential is supplied through contact plugs 64c and connecting arm 64a to the source region 4s of NMOS transistors 4, activating the cell. As in the conventional NAND cell, a NOT AND operation is performed on the input signals a, b at the input terminals 65, 66, and the result is output from the output terminal 68 as output signal y.

In the first embodiment, all current conducted by the PMOS transistors 1, 2 is conducted from the vdd rail 61 through connecting arm 63a, and all current conducted by the NMOS transistors 3, 4 is conducted to the ground rail 62 through connecting arm 64a, so the metal stubs that extended from the vdd and ground rails in the conventional layout can be eliminated. The contact plugs 63c, 64c that connect the connecting arms 63a, 64a to the vdd and ground rails 61, 62 are disposed beneath the rails 61, 62, and do not take up space in the source regions of the transistors 1, 2, 3, 4. The result is that the lateral width of the standard cell and its active areas can be reduced. Compared with the conventional layout in FIG. 6, the lateral width of the p+ active area 63 is reduced by about 12% and the total cell width is reduced by about 4%.

Second Embodiment

Figure 14:
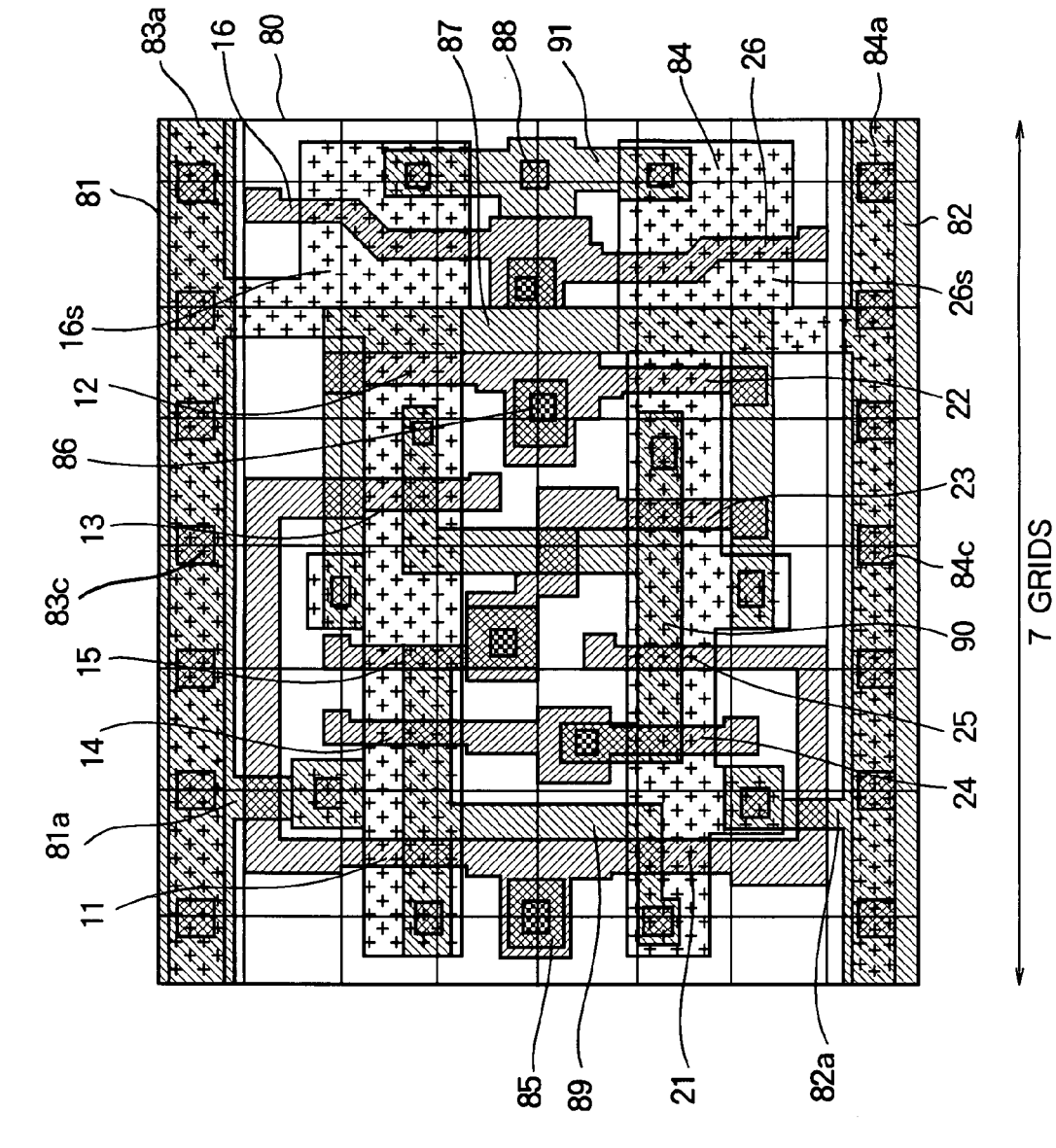
FIG. 14 is a plan view of a two-input XOR cell embodying the present invention.

FIG. 14 is a plan view of a novel layout of the two-input XOR cell shown in FIGS. 3 and 4, illustrating a second embodiment of the invention. The cell boundary 80 in this embodiment has the conventional vertical size, extending from a vdd rail 81 at the top in the drawing to a ground rail 82 at the bottom in the drawing. The lateral size of the cell boundary 80, however, is reduced to seven grids instead of the conventional eight grids.

Figure 8:
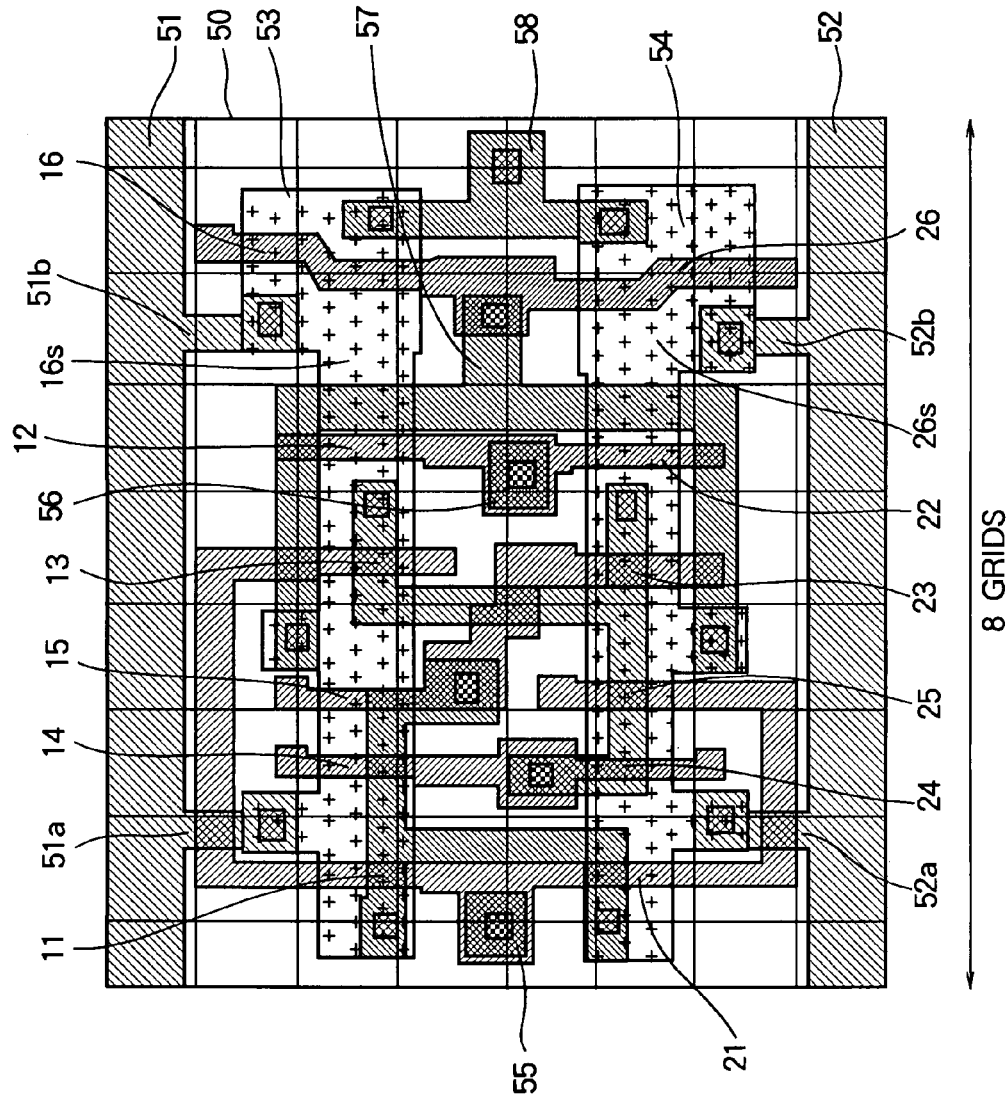
FIG. 8 is a plan view of a conventional layout of a two-input XOR cell.

A p+ active area 83 including the PMOS transistors 11, 12, 13, 14, 15, 16 shown in FIG. 3 is formed in the upper half of the cell. These PMOS transistors are disposed in substantially the same locations as in FIG. 8, but the size of the source region 16s of PMOS transistor 16 is reduced. An n+ active area including the NMOS transistors 21, 22, 23, 24, 25, 26 shown in FIG. 3 is formed in the lower half of the cell. These NMOS transistors are also disposed in substantially the same locations as in FIG. 8, but the size of the source region 26s of NMOS transistor 16 is reduced.

The p+ active area 83 differs from the conventional p+ active area in having a T-shaped connecting arm 83a with a segment extending upward from the source region 16s of PMOS transistor 16 to join a segment running laterally beneath the vdd rail 81, as indicated by the cross marks beneath the vdd rail 81. The connecting arm 83a is connected to the vdd rail 81 by a plurality of contact plugs 83c equally spaced along the vdd rail 81.

Similarly, the lower n+ active area 84 differs from the conventional n+ active area in having a T-shaped connecting arm 84a with a segment extending downward from the source region 26s of NMOS transistor 26 to join a segment running laterally beneath the ground rail 82, as indicated by the cross marks beneath the ground rail 82. This connecting arm 84a is connected to the ground rail 82 by a plurality of contact plugs 84c equally spaced along the ground rail 82.

An input terminal 85 for input of signal a in FIGS. 3 and 4, an input terminal 86 for input of signal b, and an output terminal 88 for output of signal y are aligned with the grid marks between the p+ active area 83 and the n+ active area 84.

PMOS transistors 11 to 16 and NMOS transistors 21 to 26 are interconnected to form the inverters 11-21, 12-22, analog switch 13-23, tri-state inverter 14-25, and final stage inverter 16-26 shown in FIG. 4. Specifically, the gate electrodes of transistors 11, 13, 21, and 25 are formed as a first continuous strip of polysilicon. The gate electrodes of transistors 12 and 22 are formed as a second continuous strip of polysilicon. The gate electrodes of transistors 15 and 23 are formed as a third continuous strip of polysilicon. The gate electrodes of transistors 14 and 24 are formed as a fourth continuous strip of polysilicon. The gate electrodes of transistors 16 and 26 are formed as a fifth continuous strip of polysilicon. PMOS transistors 11 and 14 have a common source region, connected through a metal stub 81a to the vdd rail 81. PMOS transistors 12 and 16 have a common source region 16s, connected through connecting arm 83a and contact plugs 83c to the vdd rail 82. The source of PMOS transistor 13 coincides with the drain of PMOS transistor 12. The source of PMOS transistor 15 coincides with the drain of PMOS transistor 14. NMOS transistors 21 and 24 have a common source region, connected through a metal stub 82a to the ground rail 82. NMOS transistors 22 and 26 have a common source region 26s, connected through connecting arm 84a and contact plugs 84c to the ground rail 84. The source of NMOS transistor 23 coincides with the drain of NMOS transistor 22. The source of NMOS transistor 25 coincides with the drain of NMOS transistor 24. The drain regions of transistors 13, 15, 23, and 25 are connected by a first metal wire 87 to the polysilicon gate electrodes of transistors 16 and 26. The drain regions of transistors 11 and 21 are connected through a second metal wire 89 to the polysilicon gate electrodes of transistors 15 and 23. The drain regions of transistors 12 and 22 are connected through a third metal wire 90 to the polysilicon gate electrodes of transistors 14 and 24. The drain regions of transistors 16 and 26 are connected to the output terminal 88 by a fourth metal wire 91. The metal stubs 81a, 82a and wires 87, 89, 90, 91 are formed in the same wiring layer as the vdd and ground rails 81, 82, metal stub 81a being an extension of the vdd rail 81 and metal stub 82a being an extension of the ground rail 82.

When vdd and ground potentials are applied to the vdd rail 81 and ground rail 82 to activate the cell, the vdd potential is supplied through metal stub 81a to the source regions of transistors 11 and 14, and through contact plugs 83c and connecting arm 83a to the source regions of PMOS transistors 12 and 16. The ground potential is supplied through metal stub 82a to the source regions of NMOS transistors 21 and 24, and through contact plugs 84c and connecting arm 84a to the source regions of NMOS transistors 22 and 26. As in the conventional cell, an XOR operation is performed on the signals a, b received at the input terminals 85, 86, and the result is output from the output terminal 88 as the output signal y.

Since the vdd and ground potentials are supplied to the source regions 16s and 26s of transistors 12, 16, 22, and 26 through the connecting arms 83a, 84a and contact plugs 83c, 84c instead of through metal stubs extending from the vdd and ground rails, these source regions 16s and 26s can be compressed. Compared with the conventional layout in FIG. 8, the gate electrodes of PMOS transistor 16 and NMOS transistor 26 are further to the left, the metal wire 91 interconnecting the drain regions of transistors 16 and 26 is likewise moved to the left, and the output terminal 88 is moved to the left by one full grid. This enables the lateral width of the standard cell in FIG. 14 to be reduced from eight grids to seven grids.

The invention is not limited to the first and second embodiments shown in the drawings. Possible modifications include, for example, the following.

(1) The layouts in FIGS. 9 and 14 can be rotated by arbitrary angles or reflected with respect to arbitrary axes. In particular, a 180° rotation, a vertical reflection, and a horizontal reflection are possible.

(2) The invention is not limited to NAND and XOR cells. Similar connecting arms can be used to reduce the size of other standard cells.

(3) A connecting arm can be provided only beneath the vdd rail, or only beneath the ground rail. For some standard cell layouts, even one connecting arm is sufficient to effect a reduction in cell size.

(4) The contact plugs that connect the vdd and ground rails to the connecting arms need not be equally spaced.

(5) When the vdd and ground rails supply power and ground potentials to a plurality of standard cells, the connecting arms may extend continuously for the entire length of the vdd and ground rails, in which case it may not be necessary to provide contact plugs within the cell boundary of every standard cell.

(6) The vdd and ground rails and metal wires and terminals may be disposed in any metal wiring layer, and need not all be disposed in the same metal wiring layer.

Those skilled in the art will recognize that further variations are possible within the scope of the invention, which is defined in the appended claims.

What is claimed is:

1. A standard cell having a rectangular cell boundary and comprising a plurality of transistors formed on a substrate between a first rail and a second rail, one of the first rail and the second rail extending laterally along an edge of the rectangular cell boundary and supplying a power supply potential to the standard cell, another one of the first rail and the second rail extending laterally along another edge of the rectangular cell boundary and supplying a ground potential to the standard cell, the standard cell including a first active area in which a first transistor of the plurality of transistors is formed, wherein the first active area extends along and in proximity to the edge of the rectangular cell boundary and has a first connecting arm extending substantially beneath the first rail, the first rail being connected to the first connecting arm of the first active area, and wherein the first connecting arm is doped with an impurity and conducts current between the first rail and the first transistor.

2. The standard cell of claim 1, further comprising:
an interlayer dielectric film having a hole; and
a contact plug disposed in the hole, electrically connecting the first connecting arm to the first rail.

3. The standard cell of claim 1, wherein the standard cell has a pair of mutually opposite sides, and the first connecting arm extends beneath the first rail from one of the mutually opposite sides to another one of the mutually opposite sides.

4. The standard cell of claim 1, wherein the first transistor is a metal-oxide-semiconductor transistor operable to conduct current supplied through the first connecting arm from the first rail.

5. The standard cell of claim 4, wherein the first transistor has a diffusion region contiguous with the first connecting arm.

6. The standard cell of claim 5, wherein said diffusion region and the first connecting arm are identically doped with an impurity.

7. The standard cell of claim 5, wherein all current conducted through the first transistor is conducted through the first connecting arm.

8. The standard cell of claim 1, further including a second active area in which a second transistor is formed, the second active area extending along and in proximity to said another edge of the rectangular cell boundary and having a second connecting arm extending substantially beneath the second rail, the second rail being connected to the second connecting arm.

9. The standard cell of claim 8, wherein:
the first transistor is a p-channel metal-oxide-semiconductor transistor;
the first connecting arm is doped with a p-type impurity;
the second transistor is an n-channel metal-oxide-semiconductor transistor; and
the second connecting arm is doped with an n-type impurity and conducts current between the second rail and the second transistor.

10. The standard cell of claim 9, wherein the first transistor has a source diffusion region contiguous with the first connecting arm, and the second transistor has a source diffusion region contiguous with the second connecting arm.

11. The standard cell of claim 10, wherein all current conducted through the first transistor is conducted through the first connecting arm and all current conducted through the second transistor is conducted through the second connecting arm.

12. The standard cell of claim 1, wherein the first connecting arm has a $\pi$ shape.

13. The standard cell of claim 12, wherein a second transistor is formed in the first active area, the first transistor and second transistor being metal-oxide-semiconductor transistors with separate source regions and a common drain region, the separate source regions being separately contiguous with the first connecting arm.

14. The standard cell of claim 1, wherein the first connecting arm has a T shape.

15. The standard cell of claim 14, wherein a second transistor is formed in the first active area, the first transistor and the second transistor being metal-oxide-semiconductor transistors with respective source regions and respective drain regions, the source region of the first transistor being contiguous with the first connecting arm, the drain region of the first transistor coinciding with the source region of the second transistor.

16. The standard cell of claim 14, wherein a second transistor is formed in the first active area, the first transistor and third transistor being metal-oxide-semiconductor transistors with separate drain regions and a common source region, the common source region being contiguous with the first connecting arm.

* * * * *